US008817475B2

(12) United States Patent
Privitera et al.

(10) Patent No.: US 8,817,475 B2
(45) Date of Patent: Aug. 26, 2014

(54) SYSTEM WITH SHARED HEATSINK

(75) Inventors: Concetto Privitera, Gravina di Catania (IT); Cristiano Gianluca Stella, San Gregorio di Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 218 days.

(21) Appl. No.: 13/537,812

(22) Filed: Jun. 29, 2012

(65) Prior Publication Data

US 2013/0003311 A1    Jan. 3, 2013

(30) Foreign Application Priority Data

Jun. 30, 2011  (IT) .............................. MI2011A1219

(51) Int. Cl.
*H05K 7/20*  (2006.01)
*H01L 23/367*  (2006.01)
*H01L 23/36*  (2006.01)
*H01L 23/40*  (2006.01)

(52) U.S. Cl.
CPC ............ *H01L 23/36* (2013.01); *H01L 23/3672* (2013.01); *H01L 23/40* (2013.01)
USPC ...... 361/718; 361/679.56; 361/704; 361/719; 361/720; 165/80.2; 165/80.3; 165/104.33

(58) Field of Classification Search
USPC ........................ 361/679.46, 679.54, 688–697, 361/704–712, 717–723; 165/80.2, 80.3, 165/80.4, 104.33, 185; 257/666, 675, 257/706–727, E21.101, E21.505, E23.01, 257/E23.102, E23.086; 174/15.1, 16.3, 174/252; 29/840, 827, 832, 835, 564.1, 29/592.1
See application file for complete search history.

(56) References Cited

U.S. PATENT DOCUMENTS

| 4,147,889 | A | | 4/1979 | Andrews et al. |
| 4,611,238 | A | | 9/1986 | Lewis et al. |
| 4,748,538 | A | * | 5/1988 | Tsuji ............................. 361/715 |
| 5,311,395 | A | * | 5/1994 | McGaha et al. .............. 361/720 |
| 5,504,652 | A | | 4/1996 | Foster et al. |
| 5,977,630 | A | * | 11/1999 | Woodworth et al. ......... 257/712 |
| 6,150,254 | A | | 11/2000 | Kito |

(Continued)

FOREIGN PATENT DOCUMENTS

| EP | 0812015 A1 | 12/1997 |
| EP | 0948047 A2 | 10/1999 |

(Continued)

OTHER PUBLICATIONS

Italian Search Report and Written Opinion for IT MI2011A001219 mailed Feb. 10, 2012 (8 pages).

*Primary Examiner* — Michail V Datskovskiy
(74) *Attorney, Agent, or Firm* — Gardere Wynne Sewell LLP

(57) ABSTRACT

First and second electronic devices each include an insulating package embedding a chip of semiconductor material which integrates at least one electronic component. Each insulating package has a mounting surface for mounting the respective electronic device on a substrate and an opposite free surface. A heatsink is fixed to the free surfaces through respective first and second base portions. A connection element is configured to connect the first base portion to the second base portion. The heatsink also includes, for each electronic device, at least one stabilizing element extending from the respective base portion to make contact with a substrate to which the mounting surfaces of the first and second electronic devices are attached.

19 Claims, 6 Drawing Sheets

(56) References Cited

U.S. PATENT DOCUMENTS

| | | | |
|---|---|---|---|
| 6,707,676 B1 | 3/2004 | Geva et al. | |
| 6,833,997 B1 | 12/2004 | Jones, III et al. | |
| 7,145,224 B2 | 12/2006 | Kawashima et al. | |
| 7,286,361 B2 * | 10/2007 | Yamanaka | 361/704 |
| 7,746,650 B2 * | 6/2010 | Hellinger et al. | 361/719 |
| 7,776,658 B2 * | 8/2010 | Liu et al. | 438/121 |
| 7,816,784 B2 | 10/2010 | Son et al. | |
| 7,851,908 B2 * | 12/2010 | Otremba et al. | 257/724 |
| 7,892,893 B2 * | 2/2011 | Obara | 438/112 |
| 8,062,932 B2 | 11/2011 | Herbert et al. | |
| 8,154,108 B2 * | 4/2012 | Liu et al. | 257/666 |
| 8,358,017 B2 | 1/2013 | Tsui | |
| 8,390,041 B2 | 3/2013 | Yoshimochi | |
| 8,481,368 B2 | 7/2013 | Xue et al. | |
| 8,604,611 B2 | 12/2013 | Hauenstein | |
| 2005/0161785 A1 | 7/2005 | Kawashima et al. | |
| 2005/0280140 A1 | 12/2005 | Corbin et al. | |
| 2006/0091512 A1 | 5/2006 | Shinohara | |
| 2007/0090523 A1 | 4/2007 | Otremba | |
| 2007/0108564 A1 | 5/2007 | Tang et al. | |
| 2007/0215996 A1 | 9/2007 | Otremba | |
| 2008/0054422 A1 | 3/2008 | Koike et al. | |
| 2009/0236732 A1 | 9/2009 | Yu et al. | |
| 2009/0323288 A1 | 12/2009 | Bernard | |
| 2010/0133674 A1 | 6/2010 | Hebert et al. | |
| 2011/0096509 A1 | 4/2011 | Yoshimochi | |
| 2013/0003305 A1 | 1/2013 | Stella | |
| 2013/0003308 A1 | 1/2013 | Stella | |
| 2013/0003311 A1 | 1/2013 | Privitera et al. | |
| 2013/0003312 A1 | 1/2013 | Stella et al. | |

FOREIGN PATENT DOCUMENTS

| | | |
|---|---|---|
| JP | 49047567 U | 4/1974 |
| JP | 58218149 A | 12/1983 |
| JP | 62104056 A | 5/1987 |
| JP | 4368155 A | 12/1992 |
| JP | 6037217 A | 2/1994 |
| JP | 8078584 A | 3/1996 |
| WO | WO-2006058030 A2 | 6/2006 |

* cited by examiner

SYSTEM WITH SHARED HEATSINK

PRIORITY CLAIM

This application claims priority from Italian Application for Patent No. MI2011A001219 filed Jun. 30, 2011, the disclosure of which is hereby incorporated by reference.

TECHNICAL FIELD

The present invention refers to the field of electronics. In particular, this invention relates to packages for electronic components.

BACKGROUND

Any existing electronic component is characterized by an absorption of electrical power—generally, proportional to the product of a current passing through the same and a voltage that develops between its terminals—during an operation thereof. A portion of the absorbed power is lost as heat according to the principles of thermodynamics. In particular, heat is generated in the "active" regions of the electronic component, i.e. where the flow of electric current occurs (e.g., with a MOSFET transistor, in a region beneath a control terminal and regions constituting the conduction terminals thereof). The heat generation concentrated in the active regions causes a rise in the temperature of the electronic component. The temperature of the active regions of the electronic component, better known as junction temperature, is a parameter that strongly affects the operation of the electronic component. In particular, a threshold voltage, typical of the electronic component (e.g., again in the case of MOSFET transistors), in relation to which the current intensity of the same is controlled, is inversely proportional to the junction temperature, as a result, with the same control voltage applied, the electronic component draws a flow of electric current which increases as the temperature increases. It is also known that, with increasing junction temperature, an increase in the electrical resistivity of the electronic component occurs, too. Consequently, the electronic component dissipates, due to the Joule effect, an increasing electric power between its terminals, and this leads to an ever rising junction temperature; in other words, a positive feedback (phenomenon called thermal runaway) is established that may cause damage or even destruction of the electronic component due to a too high junction temperature. In addition, with the rising of the junction temperature of the electronic component there is a reduction of the reliability thereof (i.e., the probability of occurrence of a structural damage during the operation increases) and generally of its operative life (i.e., the time for which the electronic component works properly).

The miniaturization process of the electronic components (basically a reduction in the size of the electronic component, in particular of the active regions), makes it very important to contain the rise in junction temperature within an acceptable range. In fact, with the same electrical power consumption, the smaller the active area of the electronic component, the greater and more rapid the rise in junction temperature of the same (since the electrical power consumption is concentrated in a smaller volume).

This is particularly important in the field of electronic components belonging to the "power electronics" sector, i.e. electronic components designed to operate at voltages and currents higher than standard electronic components (for example, with operating voltages in the order of hundreds of volts and/or with operating current in the order of the amperes), which are used in circuits of apparatuses belonging to various fields of applications, for example, from computers to electro-mechanical machinery (power supply circuits of computers, actuators of electric motors, inverters for photo-voltaic panels, etc.).

Heatsinks are known and widely used to limit the rise of the junction temperature in electronic components. A heatsink is an element consisting of one or more elements in thermally conductive material (e.g., aluminum Al), which is fixed (typically by gluing and/or double-sided adhesive material tape) to a package of the electronic component. The package is essentially an insulating package (usually in plastic or ceramic) wherein contact pins are exposed (to connect the electronic component to tracks of an external circuit), and is intended to encompass and protect a chip of semiconductor material wherein the electronic component is integrated.

Alternatively, the insulating package may also include an opening—typically formed in an upper free surface of the insulating package opposed to a mounting surface toward which the pins are oriented—for exposing a dissipation plate (made of thermally conductive material too). The dissipation plate is connected to the chip to improve heat exchange with the external environment. The heatsink can be attached directly to the dissipation plate through double-sided adhesive tapes or glues with high thermal conductivity coefficient, which conforms the contact surface, thus facilitating a conductive heat exchange between the chip and the heatsink (thanks to the increased thermal conductivity of the materials constituting the dissipation plate and the heatsink in contact with each other with respect to the plastic ones forming the insulating package).

In greater detail, the heatsinks facilitate heat transfer by conduction (thanks to their good thermal conductivity) from the chip to themselves. In addition, heatsinks are typically formed with a structure designed to facilitate a heat transfer by convection (e.g., with a plurality of fins extending from a base through which the heatsink is fixed to the insulating package or to the dissipation plate) to the environment external to the package (i.e., transferring heat to the medium that surrounds the package, for example, air). Thus, suitably sized heatsinks allow maintaining the junction temperature below a safe temperature.

However, heatsinks suffer from a major disadvantage, particularly when applied to small packages (e.g., to embedding miniaturized electronic components). Indeed, the heatsinks tend to be mechanically unstable, once fixed to the package. This is due to the fact that by reducing the size of the packages, an available mounting surface is proportionally reduced. This reduced mounting surface may be insufficient to ensure good mechanical stability for the heatsink on the package; therefore, the heatsink might separate from the package because of mechanical stresses, to which it may be subjected. In addition, the weight of the heatsink and the mechanical stresses might likely cause a deterioration, or even a breakage, of contacts formed between one or more pins of the package and the corresponding conductive tracks of the board to which they are attached, up to causing their detachment and the malfunction of a circuit wherein the electronic component is used.

In circuits comprising at least two electronic components, it is highly preferable that the junction temperatures of such components be maintained as identical as possible during circuit operation. Indeed, for an effective and efficient operation of the circuit it is necessary that the temperature-dependent operating parameters (such as, for example, threshold voltages, electric currents, internal resistances, etc.) are essentially the same for all the electronic components included in the circuit.

It is observed that heatsinks currently known in the state of the art do not allow to obtain a sufficient mechanical stability and, at the same time, to ensure sufficient uniformity in the junction temperatures of electronic components belonging to a same circuit.

SUMMARY

One or more aspects of a solution according to specific embodiments are set out in the independent claims, with advantageous features of the same solution that are set out in the dependent claims (with any advantageous features provided with reference to a specific object of the solution according to an embodiment which apply mutatis mutandis at any other of its aspects).

More specifically, one aspect of a solution according to an embodiment provides a system. The system comprises a plurality of electronic devices. Each electronic device comprises an insulating package and a chip of semiconductor material embedded in the insulating package. Said chip integrates at least one electronic component. Each insulating package has a mounting surface for mounting the respective electronic device on a substrate and a free surface opposite to the mounting surface. The system also comprises a heatsink for dissipating heat generated by each electronic device of said plurality of electronic devices. The heatsink is attached to a respective base portion of the free surface of the insulating package of each electronic device.

In a solution, the heatsink comprises at least one connection element. Each connection element connects a respective first base portion with a respective second base portion. The heatsink further comprises, for each electronic device, at least one stabilizing element extending from the respective base portion at least up to the substrate.

Another aspect of a solution according to an embodiment provides a corresponding method for realizing such system.

BRIEF DESCRIPTION OF THE DRAWINGS

A solution according to one or more embodiments, as well as additional features and its advantages will be better understood with reference to the following detailed description of an embodiment thereof, given purely by way of a non-restrictive indication and without limitation, to be read in conjunction with the attached figures (wherein corresponding elements are denoted with equal or similar references and their explanation is not repeated for the sake of brevity). In this respect, it is expressly understood that the figures are not necessarily drawn to scale (with some details that may be exaggerated and/or simplified) and that, unless otherwise specified, they are simply intended to conceptually illustrate the structures and procedures described herein. In particular.

DETAILED DESCRIPTION OF THE DRAWINGS

Figure 1A:
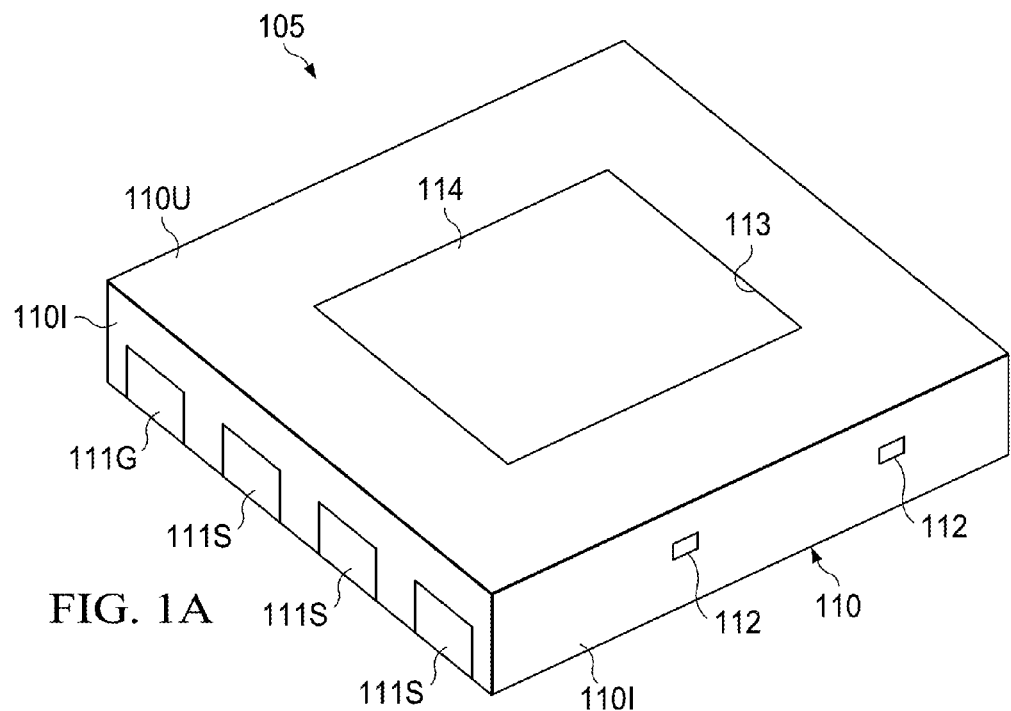
FIG. 1A illustrates a schematic axonometric view from the top of an electronic device to which the solution according to an embodiment may be applied.
Figure 1B:
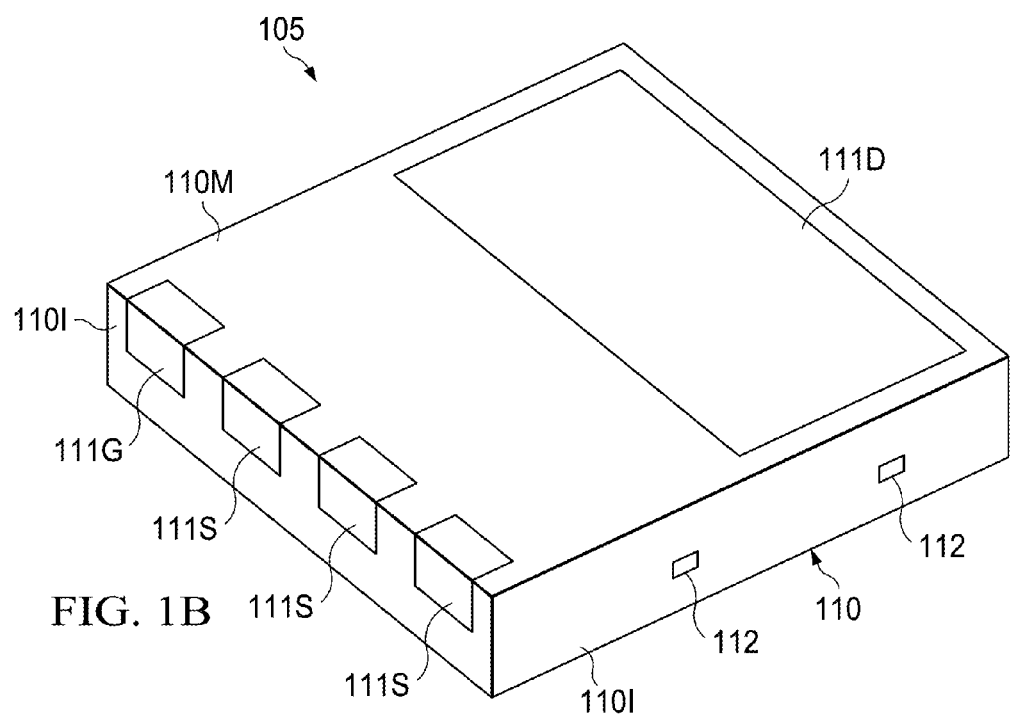
FIG. 1B illustrates a schematic axonometric view from the bottom of the same electronic device of FIG. 1A.

With reference to FIG. 1A and FIG. 1B together, schematic axonometric views from the top and from the bottom, respectively, are illustrated of an electronic device 105 to which the solution according to an embodiment may be applied. In particular, the electronic device 105 comprises an insulating package 110 generally (substantially) shaped as a parallelepiped. The insulating package has a free surface 110U and a mounting surface 110M, opposite the first and separated therefrom by means of four side surfaces 110I. The insulating package 110 is configured to protect and insulate, from the external environment, (at least) one wafer of semiconductor material, not visible in the figures, in which (at least) one electronic component is embedded.

In order to make an electrical path between the chips and elements external to the electronic device 105—thereby allowing connecting the electronic component(s) integrated in the chips to other electronic devices not shown—, several pins are provided; for example, three source pins 111S, a gate pin 111G and a drain pin 111D are provided. Each pin 111S, 111G,111D is formed by a contact pad in electric contact with corresponding conductive terminals of the chip (e.g., via connection wires, or "wire bonding" in the jargon, comprised within the insulating package 110, not shown in the figures). The pins 111S, 111G are generally square in shape, and extend partially on the mounting surface 110M and partially on a side surface 110I of the insulating package 110. On the other hand, the pin 111D is exposed on the mounting surface 110M and has a generally rectangular shape, and it covers about half of the mounting surface 110M. For example, the pin 111D is connected to a drain terminal, the pins 111S are connected to a source terminal and the pin 111G is connected to a gate terminal of a power MOS transistor. In addition, the pin 111D acts as a heatsink for transferring the heat produced by the chip in operation to the board. The chip is mounted inside the insulating package 110 on a plate that defines the pin 111D. A plurality of tie-bars 112 (used to support such plate during the construction of the insulating package 110) protrude in pairs on each side surface of the insulating package 110, between the free surface 110U and the mounting surface 110M (with the tie bars 112 which are then electrically connected to the pin 111D).

Moreover, in correspondence of the free surface 110U of the insulating package 110, an opening 113 is formed through which a dissipation plate 114 is exposed. The dissipation plate 114 is in contact with the chip in order to transfer the heat generated by the latter into the external environment (i.e., it operates as an additional heatsink). The dissipation plate 114 is typically formed of a thermally and electrically conductive material (e.g., copper Cu). The dissipation plate 114 is typically connected to the source terminal of the electronic component (and therefore to the pins 111S as well).

Figure 1C:
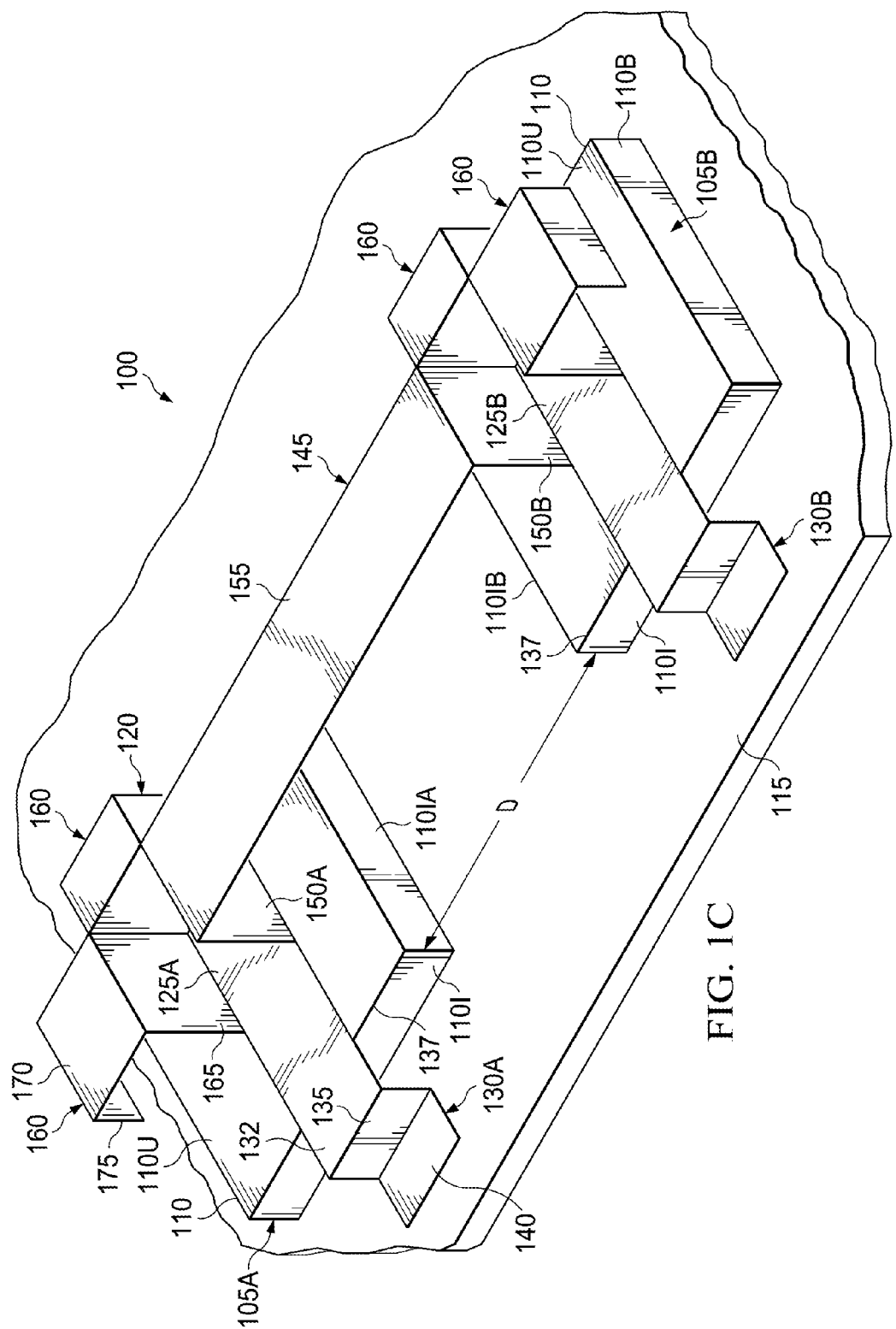
FIG. 1C illustrates a schematic axonometric view of a system according to an embodiment.
Figure 1D:
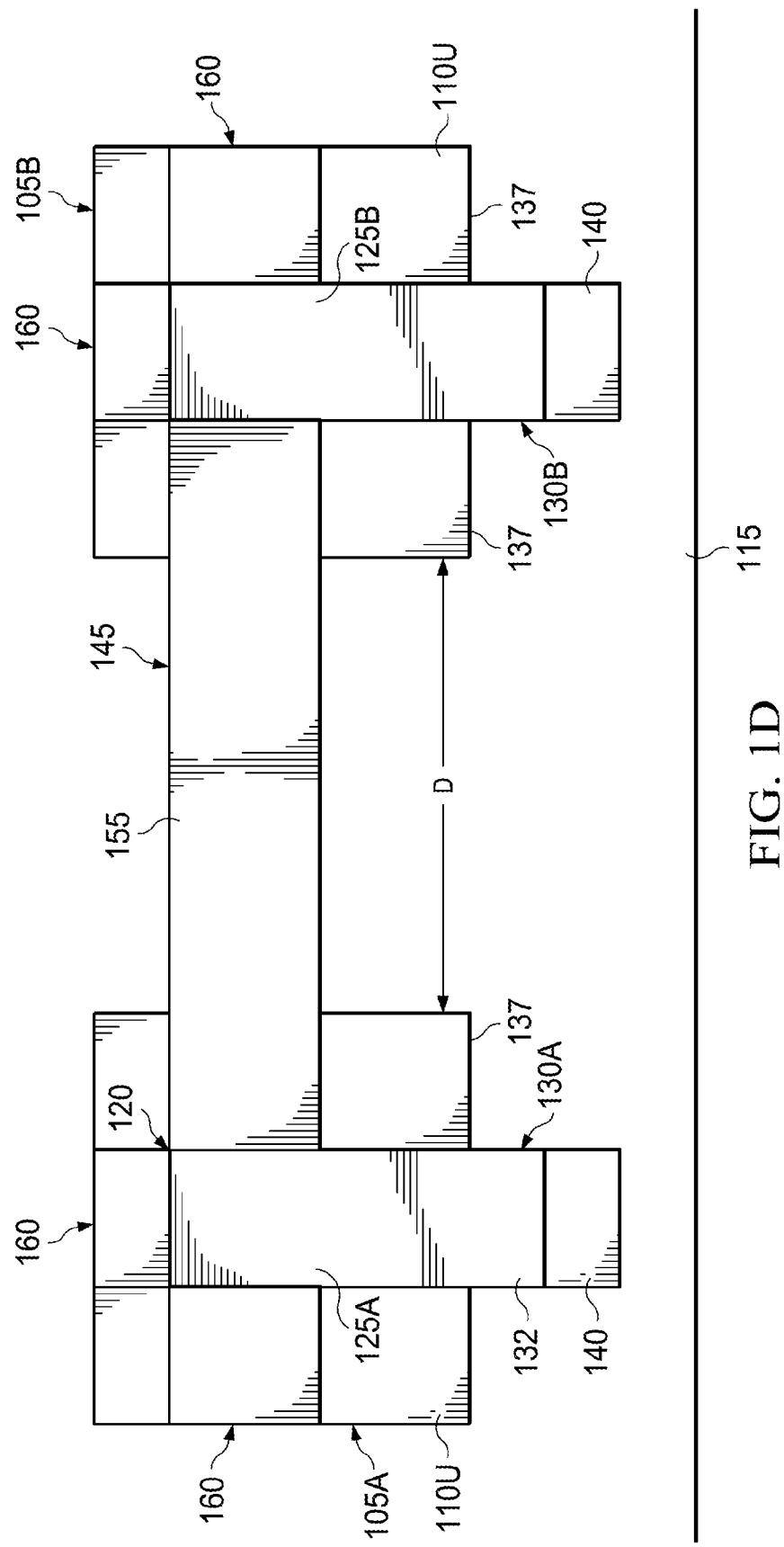
FIG. 1D illustrates a schematic plan view of the system of FIG. 1C.

With reference now to FIG. 1C and FIG. 1D together, there are illustrated isometric and plan views, respectively, of a system 100 according to an embodiment.

The system 100 comprises two electronic devices 105A and 105B just described (with the indexes A and B which are also added to the references of their components).

The electronic devices 105A and 105B are attached to a circuit board 115 (e.g., a PCB, "Printed Circuit Board"), of which only a portion is shown in the figures, typically by properly welding the pins (not shown in the figures for the sake of clarity) to the same. In the system 100 shown in figures, the electronic devices 105A and 105B are arranged on the circuit board 115 so that a side surface 110IA of the electronic device 105A is spaced by a distance D from a corresponding side surface 110IB of the electronic device 105B, faced towards the side surface 110IA.

The system 100 also comprises a heatsink 120, which is attached to the free surfaces 110U of each electronic device through corresponding base portions (or simply bases) 125A and 125B, by means of an attaching element (not shown in the figures), such as a thermal double-sided adhesive tape, a thermal glue/paste or an epoxy resin. It should be noted that the bases 125A and 125B may be attached to the previously described dissipation plate on the free surfaces 110U. In this case, unless an electrically insulating fastener (e.g., containing mica) is used, the heatsink 120 will be electrically connected to the source terminal of the MOS transistor through the dissipation plate (and therefore to the source pin as well). Generally, the heatsink 120 is not welded to the dissipation plate 114 (a weld, actually, might lead to an uneven mounting—for example, with air bubbles trapped in a filler material being used—thereby reducing the thermal conductivity between the heatsink 120 and the dissipation plate 114).

The bases 125A and 125B may be attached to dissipation plates (not visible in the figures) exposed on the free surface 110U of the electronic devices 105A and 105B, for example electrically connected to some terminals of the electronic components integrated in the chips; in this case, unless using an electrically insulating attaching element (e.g., containing mica), the heatsink 120 in its turn could be electrically connected to the integrated electronic components.

Note that, generally, the heatsink 120 is not welded to the dissipation plate. A welding, in fact, could lead to an inhomogeneous attachment and, for example, some air bubbles could remain trapped in the weld material used for welding, reducing the thermal conductivity between the heatsink and the electronic devices 105A and 105B.

The heatsink 120 further comprises for each electronic device 105A and 105B a respective protruding element (for example, a tab) 130A, 130B protruding from one edge of the corresponding base 125A, 125B beyond a boundary 137 of the respective insulating package 110. In more detail, the tab 130A protrudes from one edge of the base 125A, while the tab 130B protrudes from one edge of the base 125B. Each of these tabs 130A, 130B comprises a connection portion 132, which is parallel to the free surface 110U and lies on the same up to the boundary 137 of the insulating package 110. The connection portion 132 of the tab 130A, 130B may be attached to the latter as the base 125A, 125B. The connection portion 132 of the tab 130A, 130B extends from the boundary 137, and is connected to a mounting portion of the tab 130A, 130B (through one of its free distal ends from the insulating package 110), which is bent in such a way to present an intermediate portion 135 transversal to the free surface 110U and extending towards the mounting surface (or beyond). In the particular embodiment shown in the figure, the mounting portion of the tab 130A, 130B is also bent at the surface of the board 115 in order to have a terminal portion 140 parallel to the same, lying thus on the plane of the mounting surface, and hence also of the board 115. The terminal portion 140 is thus attached to the board 115 with the same expedients described with respect to the base 125A, 125B.

Alternatively, the intermediate portion 135 of the tabs 130A and 130B may be configured to pass through the board 115 and be attached thereto through appropriate through-holes.

In the solution according to an embodiment, the heatsink 120 comprises a connection element 145 which connects together the bases 125A and 125B attached to the respective electronic devices 105A and 105B. In more detail, the connection element 145 comprises two transversal origin portions 150A, 150B and an interconnection portion 155.

Each transversal portion 150A, 150B extends transversal to the free surface 110U of the insulating package 110 of the respective electronic device 105A, 105B. Preferably, each transversal portion 150A, 150B extends from a boundary of the respective base 125A, 125B. The interconnection portion 155 extends substantially parallel to the free surfaces 110U of the packages 110 of the electronic devices 105A and 105B and is coupled to the transversal portions 150A and 150B through corresponding opposite ends.

From further edges of both bases 125A and 125B fins 160 extend substantially transversal to the free surface 110U of the insulating package 110 (departing from the same, up in the figures). Each fin 160 comprises (preferably, although without limitation) in succession from the base 125A, 125B a proximal portion 165, a distal portion 170 and a terminal portion 175. In more detail, the proximal portion 165 extends transversal to the free surface 110U of the insulating package 110 from the base 125A, 125B; the distal portion 170 is bent outward in such a way to be parallel to the free surface 110U of the insulating package 110, and the terminal portion 175 is bent in such a way to be parallel to the proximal portion 165 (thus transversal to the free surface 110U) and to extend towards the free surface 110U (i.e., down in the figures). The distal portion 170 and the end portion 175 concentrate the heat transfer by convection in a location far away from the electronic device 105A, 105B in such a way to facilitate the cooling of the chip of the electronic component during operation.

Once attached to the board 115, the system 100 is mechanically stable. The mechanical stability of the system 100 is obtained thanks to the presence of the tabs 130A and 130B, which tightly bind the insulated packages 110 to the tab 115. In addition, the weight of the heatsink 120 is discharged at least partly directly on the board 115 through the tabs 130A and 130B. In this way it is cancelled, or at least reduced, the possibility of the occurrence of a deterioration, or even of a break of contacts formed between one or more pins of the insulating package 110 and corresponding conductive tracks (to which they are attached) due to the weight of heatsink 120 and/or to mechanical stresses. The system 100 is mechanically reliable and at the same time effectively dissipates the heat produced by the operation of chips embedded in the insulated packages 110 of both electronic devices 105A and 105B.

In addition, during operation the system 100 guarantees a substantially uniform operating or junction temperature of the chips. This is particularly advantageous in the cases wherein a good matching between the operating parameters of the electronic components (electrical currents, threshold voltages, resistances, etc.) integrated in the chips is requested, as in the case wherein electronic devices 105A and 105B are connected in parallel, or in the same side of a bridge circuit.

At the same time, both the protruding elements 125A and 125B, and the connection element 145 contribute to the heat dissipation by transferring heat by convection to the external environment in a manner similar to the fins 160.

Moreover, the protruding elements 125A and 125B also transfer heat to the board 115 by conduction through the respective terminal portion 140.

Finally, the heatsink 120 (which is biased to the voltage of the source pins 111S as previously described) is designed and placed on the insulating package 110 so as to ensure compliance with appropriate safety distances between portions of the heatsink 120 and the pins 111G and 111D, and between the portions of the heatsink 120 and the tie bars 112, to prevent the occurrence of arc discharges, or corona phenomena, since such elements are biased to different potential levels during the operation of the electronic device 100. Such safety distances comprise the so-called surface distance or "creepage" and the so-called air distance or "clearance". In particular, the surface distance is defined as the minimum distance between two elements of the electronic device—each biased to a different level of electric potential—measured along surfaces of the electronic device, such that between this pair of elements no electric arc discharge originates. Furthermore, the air distance is defined as the minimum distance between two elements of the electronic device—each biased to a different level of electric potential—measured as direct distance, such that between this pair of elements no electric arc discharge originates. Both the surface distance and the air distance are proportional to the difference between the voltages of the biased elements (for example, with a factor of proportionality between 1 mm/KV and 10 mm/KV); thus, such distances are greater in the case of power electronic devices (due to the high potential differences between terminals of the electronic component).

In detail, the heatsink 120 should be positioned so that each of its parts (i.e., the base portions 125A, 125B, the protruding element 130A, 130B, the connection element 145 and the fins 160) is at least at a first surface distance x (of the order of millimeters) from the pin 111G and at least at a second surface distance y from the tie bars 112—again of the order of millimeters and greater than the first surface distance x since the tie bars 112 are biased to the voltage of the pin 111D, higher than the voltage of the pin 111G—to prevent the occurrence of surface electric discharges along the surfaces of the insulating package 110 and/or the board 115. In addition, the heatsink 120 should comply with a first air distance u (of the order of millimeters) from the gate pin 111G, and a second air distance t from the tie bars 112—of the order of millimeters, as in the previous case greater than the first air distance u because of the increased voltage to which the tie bars 112 are biased with respect to gate pin 111G—to prevent the occurrence of electric arc discharges between the pin 111G or the tie bars 112 and the heatsink 120 through the medium by which each electronic device 105A,105B is surrounded (e.g., air).

It is emphasized that the solution described above may also be applied to a package/heatsink system adapted to be put on the market without the chip, which may then be placed inside the package later on by the buyer.

Figure 2:
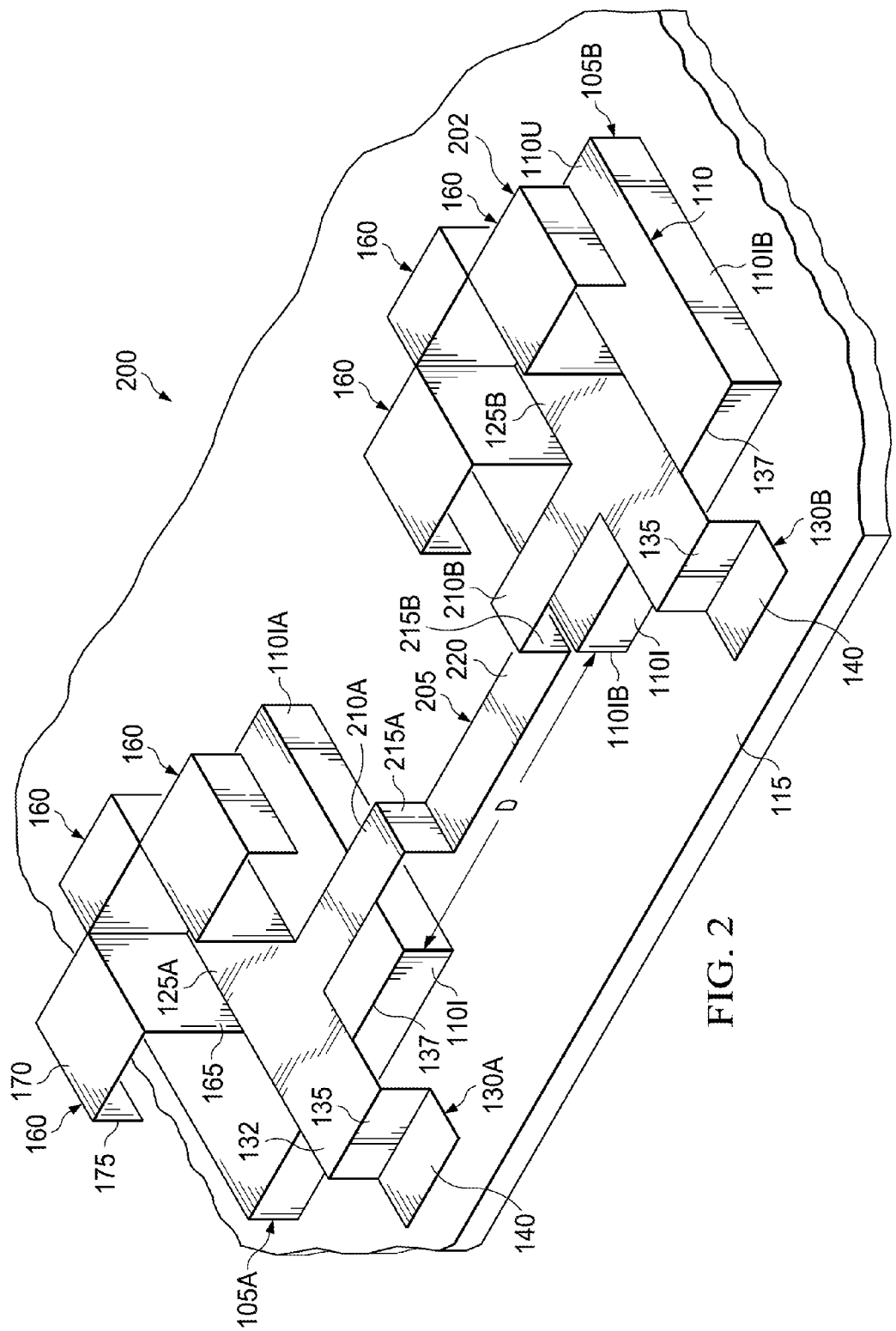
FIG. 2 illustrates a schematic axonometric view of a further system according to a further embodiment.

Turning now to FIG. 2, a further system 200 according to a further embodiment is described.

The system 200 differs from the system described above in connection with FIG. 1A and FIG. 1B in that the heatsink (in FIG. 2 identified with the reference 202) is provided with a different connection element 205.

The connection element 205 comprises two origin portions, each divided into a superficial portion 210A, 210B and an intermediate portion 215A, 215B. In addition, the connection element 205 comprises an interconnection portion 220.

In greater detail, the superficial portion 210A extends substantially parallel to and in contact with the free surface 110U of the insulating package 110 of the electronic device 105A from an edge of the base 125A up to protrude beyond the boundary 137, in the direction of the electronic device 105B. Similarly, the superficial portion 210B extends substantially parallel to and in contact with the free surface 110U of the insulating package 110 of the electronic device 105B starting from an edge of the base 125B up to protrude beyond the boundary 137, in the direction of the electronic device 105A. Each intermediate portion 215A, 215B extends—starting from a free end of the corresponding superficial portion 210A, 210B—substantially parallel to the corresponding side surface 110IA, 110IB at least up to the board 115 (thus at least up to reach the plane on which lies the mounting surface of the electronic devices 105A and 105B). Finally, the interconnection portion 220 connects the two intermediate portions 215A and 215B extending—from respective ends of the intermediate portions 215A and 215B—substantially parallel to and in contact with the board 115.

The interconnection portion 220 can be attached to the board 115 on an especially designed area (not shown) or directly on the surface of the same in the same manner as described above with respect to the mounting of the bases 125A and 125B on the package 103.

In this way, the connection element 205 provides to the system 200 an improved resistance towards mechanical stresses that may affect the electronic devices 105A and 105B.

At the same time, the alternative connection element 205 as well contributes to the dissipation of heat mainly by conduction through the board 115.

According to a further embodiment, the heatsink comprises both a connection element that lies on the board (such as the connection element 205 of FIG. 2) and a connection element spaced from the latter (such as the connection element 145 of FIGS. 1A-1B).

It should be noted that, in this case, each component of the connection element 205 (i.e., the superficial portions 210A and 210B, the intermediate portions 215A and 215B and the interconnection portion 220) extends so as to ensure a distance between them and the gate pin (not shown in the figure for sake of clarity), and between them and the tie bars (not shown in the figure for sake of clarity), greater than or equal to the first surface distance x and the second surface distance y, respectively, and at the same time greater than or equal to the first air distance u and the second air distance t, respectively, in order to avoid the above-mentioned hazards of arc discharge.

Figure 3:
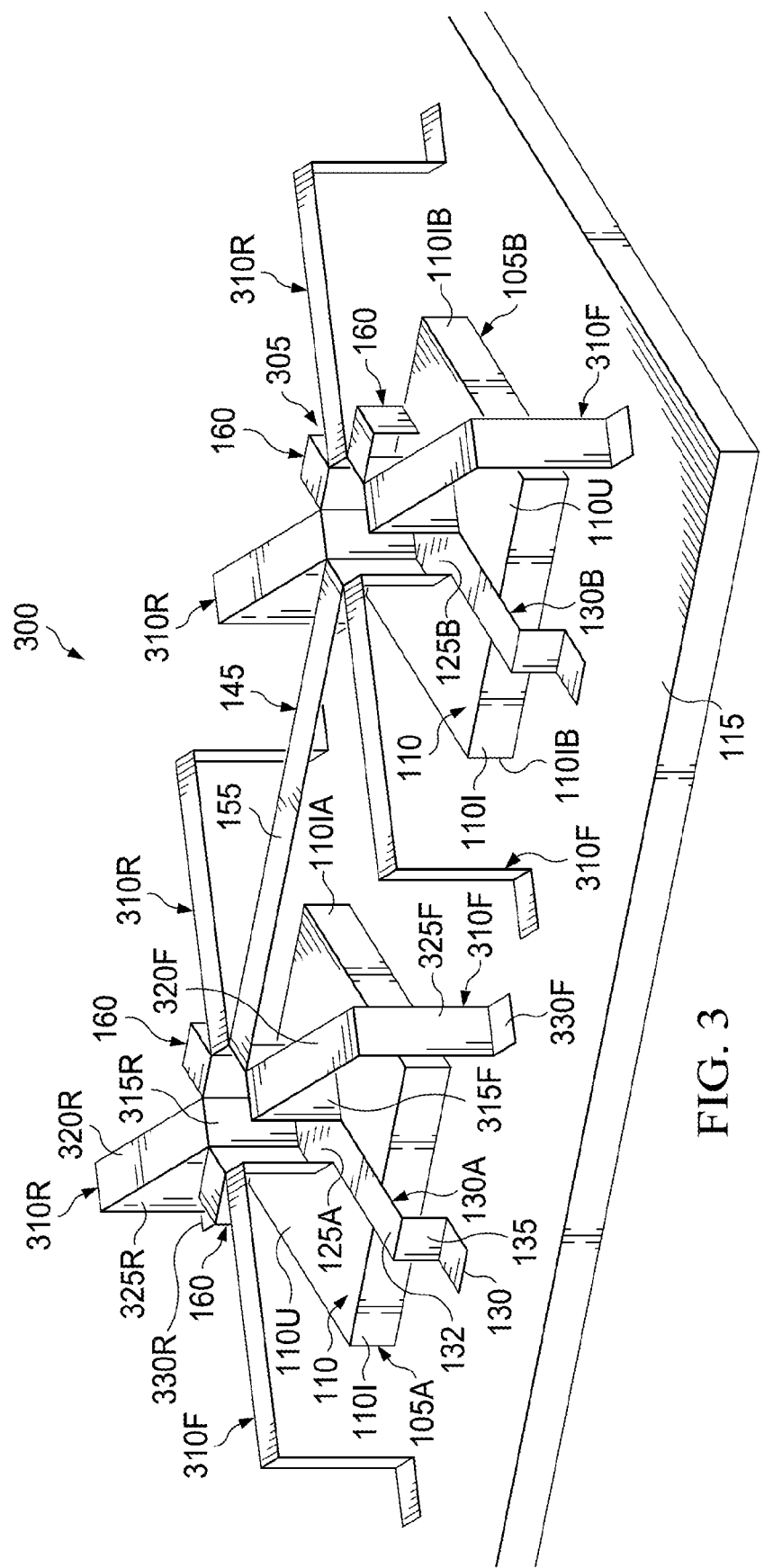
FIG. 3 illustrates a schematic axonometric view of a still further system according to still further embodiment.

With reference to FIG. 3 a system 300 is described according to a still further embodiment.

In particular, the system 300 comprises a heatsink 305 having front arched stabilization elements 310F and rear arched stabilization elements 310R—two front stabilization elements 310F and two rear stabilization elements 310R in the embodiment illustrated in the figure. The arched stabilization elements 310F and 310R extend from edges of each base 125A, 125B in such a way to be interspersed with the fins 160.

Preferably, though not necessarily, the stabilizing elements 310F and 310R are formed in such a way that each front stabilization element 310F is diametrically opposed to a rear stabilization element 310R.

Each stabilization element 310F, 310R comprises (in succession from the base 125A, 125B) an attaching portion subdivided in a proximal portion 315F, 315R and a distal portion 320F, 320R; each stabilization element 310F, 310R also comprises a mounting portion subdivided in a connection portion 325F, 325R and a terminal portion 330F, 330R.

In greater detail, the proximal portion 315F, 315R extends transversal to the free surface 110U of the insulating package 110 connected to the base 125A, 125B. The distal portion 320F, 320R is bent outward in such a way to be parallel to the free surface 110U of the insulating package 110 and extends in plan beyond the boundary 137 of the insulating package 110. The connection portion 325F, 325R is bent in such a way to be parallel to the proximal portion 315F, 315R (hence transversal to the free surface 110U) and extends up to reach the plane defined by the board 115. Finally, the terminal portion 330F, 330R is bent in such a way to lie on and be parallel to the plane defined by the board 115 (and therefore also to the plane on which the mounting surface of the electronic devices 105A and 105B lies).

Alternatively, each connection portion 325F, 325R may be configured to pass through the board 115 and be attached to the same through appropriate through-holes.

Preferably, though not necessarily, the terminal portion 330F, 330R extends along the surface of the board 115 in the direction opposite to that of the corresponding electronic device 105A, 105B. Moreover, the terminal portion 330F, 330R may be attached to the board 115 (e.g., on appropriate areas, not shown) as previously described in relation to the base 125A, 125B.

According to an embodiment, the stabilizing elements 310F and 310R that extend between the electronic devices 105A and 105B may be in contact with each other, for example, by sharing their respective end portions 330F and 330R. This allows for a containment of the area occupied on the board 115 and increases the structural strength of the heatsink 305.

It should be noted that the stabilizing elements 310F and 310R operate a mechanical bond between the heatsink 305 and the board 115 through the end portions 330F and 330R attached to the board 115. In addition, the heatsink 305 is attached with great robustness to the insulating package 110. Indeed, the stabilizing elements 310F and 310R are formed with a structure that exerts a spring force that maintains the heatsink 305 substantially pushed against the free surface 110U of the insulating package 110, superimposing to the mechanical bound guaranteed by the mounting base 320 to the free surface 110U of the insulating package 110 described above.

Finally, the stabilizing elements 310F and 310R exert a damping function of the mechanical stresses, which are (at least partially) discharged on the board 115 instead of affecting, and potentially compromising, the attachment between the base 125A,125B and the free surface 110U of the insulating package 110.

It should be considered also that the stabilizing elements 310F and 310R dissipate heat transferred by the insulating package 110 to the base 125A, 125B in a similar manner to the heat dissipation performed by the fins 160 previously described.

According to a further embodiment, the heatsink comprises stabilizing elements 310F and 310R, but no protruding element such as the tabs 130A and 130B.

It should be noted that, in this case, each component of the stabilizing elements 310F and 310R (i.e., the proximal portions 315F and 315R, the distal portions 320F and 320R, the connection portions 325F and 325R, and the terminal portions 330F and 330R) extends so as to ensure a distance between them and the gate pin (not shown in the figure for sake of clarity), and between them and the tie bars (not shown in the figure for sake of clarity), greater than or equal to the first surface distance x and the second surface distance y, respectively, and at the same time greater than or equal to the first air distance u and the second air distance t, respectively, in order to avoid the above-mentioned hazards of arc discharge.

Figure 4:
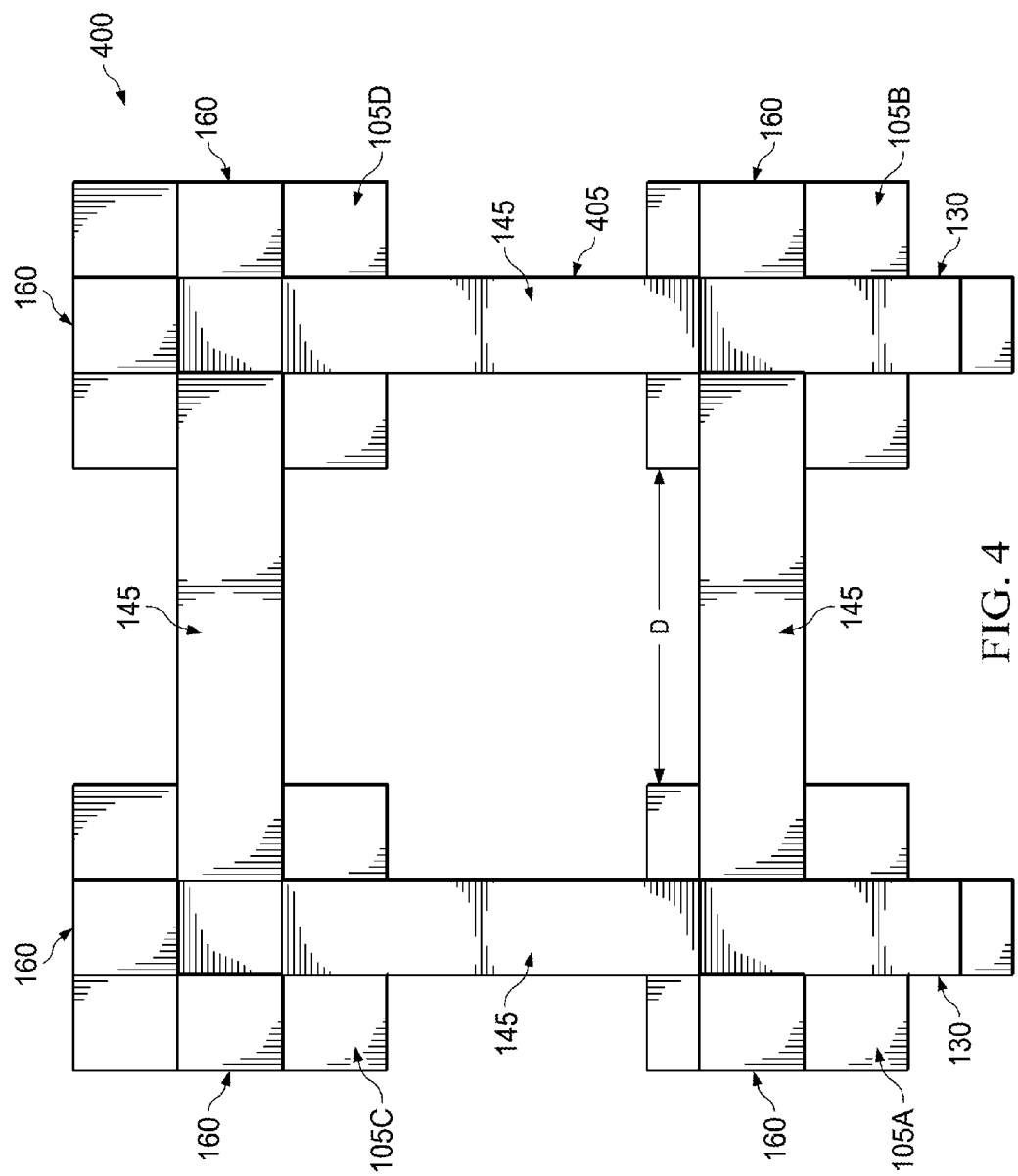
FIG. 4 illustrates a schematic plan view of a system according to another embodiment.

The concepts disclosed so far can be applied to systems containing more than two electronic devices. By referring to FIG. 4 there is shown a case in which four electronic devices 105A, 105B, 105C and 105D are provided with a single common heatsink 405.

In other embodiments (not shown in the figures) it is possible to provide heatsinks with additional fins or pins arranged on the surface of the bases, which protrude away from the same for further increasing the heat exchange between the electronic devices of the bridge assembly and the external environment.

In still other embodiments (not shown in the figures) aeration openings are provided in the fins and/or in the protruding elements and/or in the connection elements and/or in the stabilization elements. This configuration of the heatsink is advantageous in the cases in which it is required a greater heat transfer through heat convection rather than through the phenomenon of conduction (e.g., in implementations in which the electronic component is maintained operative for long periods of time, for example in the order of hours or days). Indeed, the openings allow a greater circulation of air between the parts of the heatsink with respect to the case of filled parts of the above-described embodiments. Furthermore, as it is known, the convective heat transfer is proportional to the perimeter of the heatsink that is substantially increased by the presence of the openings.

In general, all the above described heatsinks can be formed through a molding process of a sheet of thermally conductive material (e.g., an aluminum sheet), followed by a bending phase of the molded sheet. Consequently, these heatsinks can be manufactured in large volumes at low cost and with relatively simple manufacturing equipment.

Naturally, in order to satisfy local and specific requirements, a person skilled in the art may apply to the solution described above many logical and/or physical modifications and alterations. More specifically, although this solution has been described with a certain degree of particularity with reference to one or more embodiments thereof, it should be understood that various omissions, substitutions and changes in the form and details as well as other embodiments are possible. Particularly, different embodiments may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any embodiment of the disclosed solution may be incorporated in any other embodiment as a matter of general design choice. For example, the solution according to the present invention is not limited to SMT but it is applicable to other mounting technologies, for example, the Through-Hole Technology or THT.

It should be readily apparent that the proposed solution might be part of the design of an integrated device. The design may also be created in a programming language; in addition, if the designer does not manufacture electronic device, the design may be transmitted through physical means to others. Moreover, the proposed structure may be mounted in intermediate products (such as motherboards). In any case, the solution is adapted to be used in complex systems (such as automotive applications or mechanisms actuation systems).

Similar considerations apply if the same solution is implemented by an equivalent method (using similar steps with the same functions of more steps or portions thereof, removing some steps being not essential, or adding further optional steps); moreover, the steps may be performed in different order, in parallel or overlapping (at least in part).

The concepts may be applied to electronic systems comprising any number of different electronic devices.

What is claimed is:

1. A system, comprising:
   a plurality of electronic devices, each electronic device comprising an insulating package and a chip of semiconductor material embedded in the insulating package, said chip integrating at least one electronic component having a plurality of terminals, and at least one electrically conductive element exposed from the insulating package, each electrically conductive element being electrically connected to a first one of the terminals within the insulating body, and
   a heatsink for dissipating heat generated by each electronic device, the heatsink having a plurality of base portions each base portion attached to a corresponding insulating package,
   at least one connection element configured to connect a corresponding pair of the base portions, and
   an electrical connection of the heatsink to a second one of the terminals of each electronic component within the corresponding insulating body,
   wherein the heatsink is at least at a creepage distance from each electrically conductive element.

2. The system according to claim 1, wherein each insulating package has a mounting surface for mounting the electronic device on a substrate and a free surface opposite the mounting surface, each base portion being attached to the free surface of the corresponding insulating package, and wherein the heat sink further comprises at least one stabilizing element extending from each base portion at least up to a plane of the mounting surface.

3. The system according to claim 2, wherein the connection element comprises:
   a first origin portion extending transversally from the first base portion;
   a second origin portion extending transversally from the second base portion, and
   an interconnection portion extending transversally between said first origin portion and said second origin portion.

4. The system according to claim 3, wherein at least one part of said interconnection portion lies on a plane of the mounting surface.

5. The system according to claim 3, wherein the interconnection portion is spaced away from a plane of the mounting surface and extends substantially parallel thereto.

6. The system according to claim 3, wherein at least one part of each origin portion lies on the corresponding free surface.

7. The system according to claim 2, wherein the at least one stabilizing element comprises at least a first stabilizing element, said at least a first stabilizing element comprising:
   a connection portion extending partly in contact with the free surface and extending beyond a boundary of the free surface, the connection portion having a free end distal with respect to the insulating body, and
   a mounting portion extending from the free end of the connection portion at least up to a plane of the mounting surface.

8. The system according to claim 2, wherein the at least one stabilizing element comprises at least one second stabilizing element, said at least one second stabilizing element comprising:
   an attaching portion extending at least partially transversal to the free surface beyond a border of the free surface in plan, the attaching portion having a bonding end bound to the free surface and a free end opposite to the bonding end, and
   a mounting portion extending from the free end of the connection portion at least up to a plane of the mounting surface.

9. A method, comprising:
   providing a plurality of electronic devices, each electronic device comprising an insulating package and a chip of semiconductor material embedded in the insulating package, said chip incorporating at least one electronic component having a plurality of terminals, and at least one electrically conductive element exposed from the insulating package, each electrically conductive element being electrically connected to a first one of the terminals within the insulating body,
   providing a heatsink for dissipating heat generated by each electronic device, the heatsink having a plurality of base portions each base portion attached to a corresponding insulating package,
   providing at least one connection element connecting a corresponding pair of the base portions,
   electrically connecting the heatsink to a second one of the terminals of each electronic component within the corresponding insulating body, and
   placing the heatsink at least at a creepage distance from each electrically conductive element.

10. The method according to claim 9, wherein providing the heatsink comprises:
    forming the heatsink from a sheet of thermally conductive material through a process of molding and bending.

11. A heatsink, comprising:
    a first base portion configured to be attached to a first free surface of a first electronic device insulating package,
    a second base portion configured to be attached to a second free surface of a second electronic device insulating package,
    a connection element connecting the first base portion to the second base portion, and
    at least one stabilizing element extending from each of the first and second base portions, wherein the at least one stabilizing element includes a distal portion coplanar with the connection element.

12. The heatsink of claim 11, wherein said first and second electronic device insulating packages have a mounting surface configured to mount to a support board, and wherein each stabilizing element is configured to extend at least to the mounting surface.

13. The heatsink of claim 11, wherein the connection element comprises:
    a first origin portion extending from the first base portion;
    a second origin portion extending from the second base portion, and
    an interconnection portion which connects said first origin portion with said second origin portion.

14. The heatsink of claim 13, wherein said first and second electronic device insulating packages have a mounting surface configured to mount to a support board, and wherein said interconnection portion is configured to be in contact with said support board.

15. The heatsink of claim 13, wherein said first and second electronic device insulating packages have a mounting surface configured to mount to a support board, and wherein the interconnection portion is spaced away from the support board and extends substantially parallel to the support board.

16. The heatsink of claim 13, wherein:
at least one part of the first origin portion lies on the free surface of the first electronic device insulating package, and
at least one part of the second origin portion lies on the free surface of the second electronic device insulating package.

17. The heatsink of claim 13, wherein:
at least one part of the first origin portion extends transversal to the free surface of the first electronic device insulating package, and
at least one part of the second origin portion extends transversal to the free surface of the second electronic device insulating package.

18. The heatsink of claim 11, wherein the at least one stabilizing element comprises at least a first stabilizing element, said at least a first stabilizing element comprising:

a connection portion extending partly in contact with the free surface and extending beyond a boundary of the free surface, the connection portion having a free end distal with respect to the insulating body, and
a mounting portion extending from the free end portion of the connection.

19. The heatsink of claim 11, wherein the at least one stabilizing element comprises at least one second stabilizing element, said at least one second stabilizing element comprising:
an attaching portion extending at least partially transversal to the free surface beyond a border of the free surface in plan, the attaching portion having a bonding end bound to the free surface and a free end opposite to the bonding end, and
a mounting portion extending from the free end of the connection portion.

\* \* \* \* \*